Figure 1:
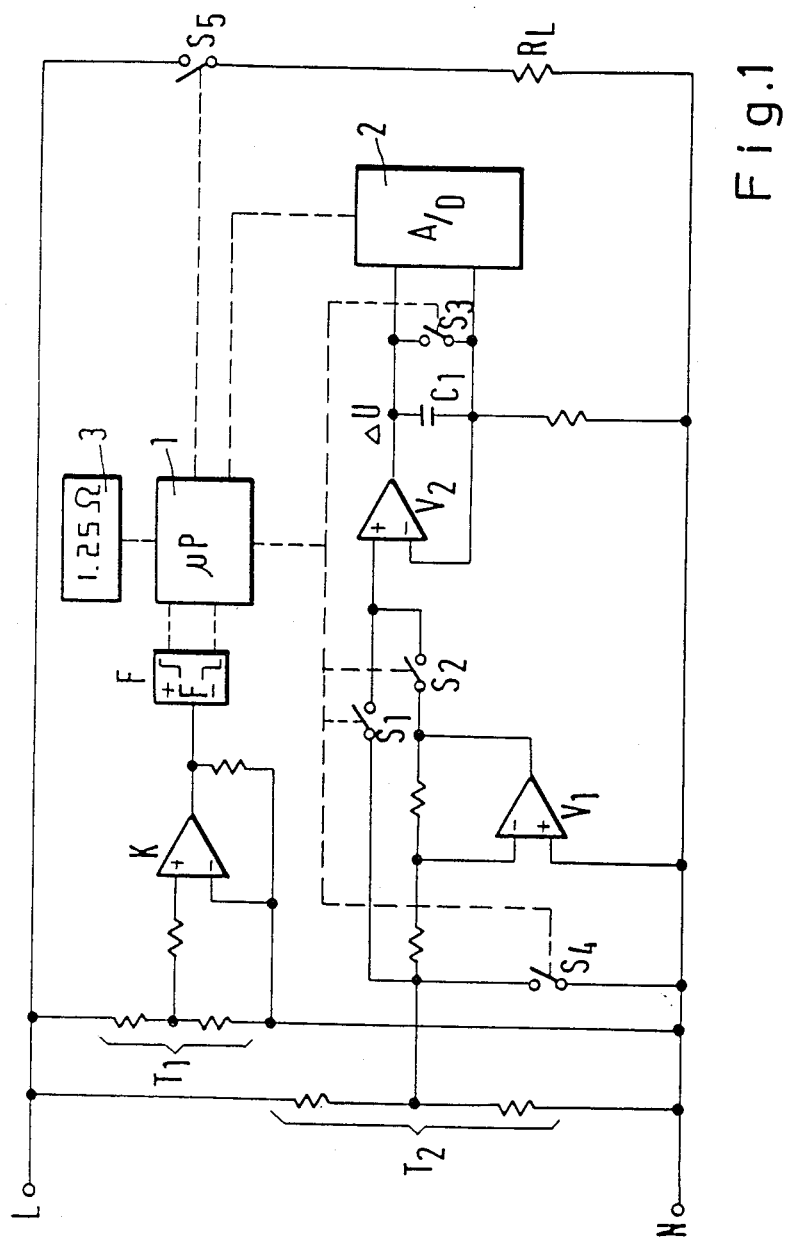

United States Patent [19]

Roppelt et al.

[11] Patent Number: 4,864,224

[45] Date of Patent: Sep. 5, 1989

[54] MEASURING METHOD FOR DETERMINING THE DIFFERENCE BETWEEN AN A-C VOLTAGE AND ANOTHER VOLTAGE, AS WELL AS A MEASURING DEVICE FOR CARRYING OUT THE SAME

[75] Inventors: Guenter Roppelt, Nuremberg; Fuerth Schick, Albrechtstrasse; Herbert Ziegler, Nuremberg, all of Fed. Rep. of Germany

[73] Assignee: Brown, Boveri & Cie Aktiengesellschaft, Mannheim, Fed. Rep. of Germany

[21] Appl. No.: 743,767

[22] Filed: Jun. 12, 1985

[30] Foreign Application Priority Data

Jun. 13, 1984 [DE] Fed. Rep. of Germany ....... 3421873

[51] Int. Cl.$^4$ ..................... G01R 19/22; G01R 17/06
[52] U.S. Cl. .................... 324/119; 324/111; 324/99 D
[58] Field of Search ........... 324/102, 111, 112, 140 R, 324/99 D, 126; 328/127; 364/574, 575, 811; 73/861.17

[56] References Cited

U.S. PATENT DOCUMENTS 3,354,453 11/1967 Hibbits et al. .................... 324/99 D
3,480,949 11/1969 Charbonnier et al. ........... 324/99 D
3,624,643 11/1971 Richman ............... 364/811
3,696,403 10/1972 Dirocco ............... 324/99 D
3,729,733 4/1973 Dorey ............... 324/99 D
4,082,998 4/1978 Marriott ............... 324/111

FOREIGN PATENT DOCUMENTS 0117132 8/1984 European Pat. Off. .

OTHER PUBLICATIONS

Journal of Physics E. Scientific Instruments, vol. 15, No. 8, Aug. 1982, pp. 789–806, Dorking, GB, A.R. Owens: "Digital Signal Conditioning and Conversion".

Primary Examiner—Reinhard J. Eisenzopf
Assistant Examiner—Vinh P. Nguyen
Attorney, Agent, or Firm—Herbert L. Lerner; Laurence A. Greenberg

[57] ABSTRACT

A method for measuring the difference between two voltages with a time-controlled measuring cycle includes feeding two voltages with opposite polarity to one integrator, initially integrating up one of the voltages and subsequently integrating down the other of the voltages with the integrator in an integration cycle, and delivering a voltage corresponding to the mean valve of the difference between the voltage at an output at the conclusion of the integration cycle.

30 Claims, 2 Drawing Sheets

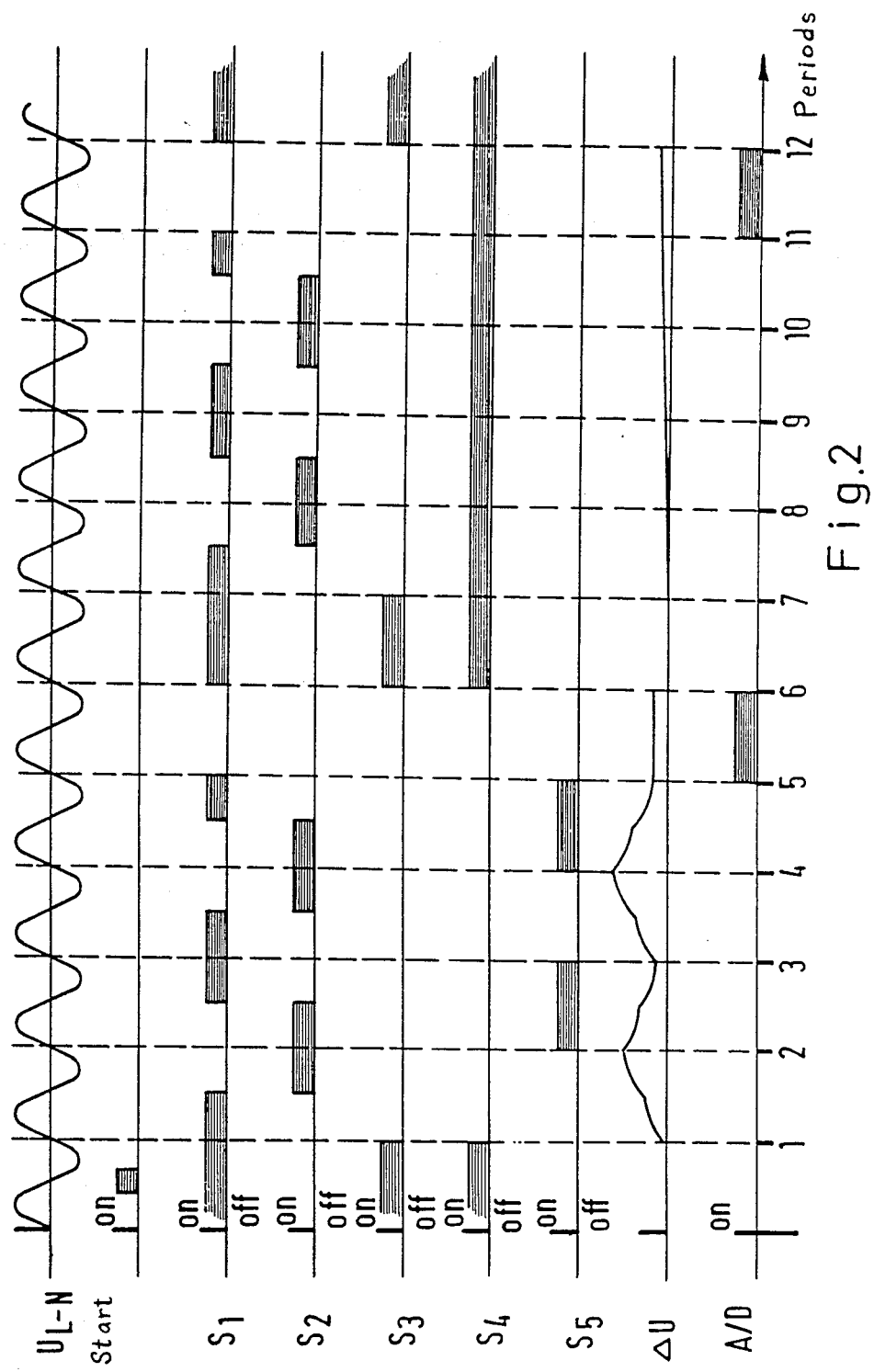

MEASURING METHOD FOR DETERMINING THE DIFFERENCE BETWEEN AN A-C VOLTAGE AND ANOTHER VOLTAGE, AS WELL AS A MEASURING DEVICE FOR CARRYING OUT THE SAME

The invention relates to a measuring method and device for determining the difference between two voltages with a time-controlled measuring cycle ensuring that first one and then the other voltage is integrated in successive, firmly predetermined time spans The difference between two voltages must be determined relatively frequently in measuring technology. In the case of d-c voltages, this is generally simple because the difference is obtained directly by subtraction of one voltage from the other. However, if at least one of the two voltages is an a-c voltage, the a-c voltage is first rectified and the mean value is formed by an integrator. The a-c voltage is thus converted into a d-c voltage. In order to obtain a useful mean value, a multiplicity of rectified a-c voltage half-waves is usually integrated with a relatively large time constant The prior art circuits are therefore consequently sluggish.

The publication "Electrotechnische Zeitschrift", vol 102 (1981), No. 14, pages 762 to 764, describes a measuring method for measuring the difference between two a-c voltages, wherein a first a-c voltage is measured under no load and a second a-c voltage under a load at an a-c voltage source. In this method, the time-controlled measuring cycle is used; first, exactly one half-wave of the first a-c voltage is integrated and thus, a first mean value U1 is formed, the same measurement is then repeated with the second a-c voltage to determine a second mean value U2. The required difference voltage $\Delta U$ is obtained by forming the difference between the amounts or by vectorial addition of the voltage U1 and the voltage U2.

While this method for determining the difference voltage is substantially faster than other conventional methods, it nevertheless has various shortcomings. Thus, relatively large errors occur in the case of small difference voltages, since the measuring error of U1 and U2 can become larger than the actual difference $\Delta U$. In addition, the method is elaborate since the integrations must also be followed by a vectorial addition.

It is accordingly an object of the invention to provide a measuring method for determining the difference between an a-c voltage and another voltage, as well as a measuring device for carrying out the same, which overcomes the hereinafore-mentioned disadvantages of the heretofore-known methods and devices of this general type, and which permits a particularly fast measurement with only inherently small errors to be carried out.

With the foregoing and other objects in view there is provided, in accordance with the invention a method for measuring the difference between two voltages with a time-controlled measuring cycle, which comprises feeding two voltages with opposite polarity to one integrator, initially integrating up one of the voltages and subsequently integrating down the other of the voltages with the integrator in an integration cycle in successive, firmly predetermined time spans or preferably over the same time span, and delivering a voltage corresponding to the mean valve of the difference between the voltage at an output at the conclusion of the integration cycle.

In accordance with a further mode of the invention, there is provided a method which comprises performing the steps of integrating up and integrating down over the same time span.

The method according to the invention provides a substantial simplification since no longer must two values be determined separately in order to then form their difference, but the desired difference voltage can rather be taken off directly at the integrator. It is perhaps even more significant that in this way the measuring error is also reduced decisively. If it is assumed that an error of 1% is generated, according to the method of the invention of integrating up and down for determining the difference voltage, this error can easily reach 40% and more if the difference of separate voltages U1, U2 is formed later.

The method is of special significance if at least one of the two voltages, between which a difference is to be measured, is an a-c voltage. Normally, the second voltage will also be an a-c voltage and in accordance with another mode of the invention, there is provided a method, which comprises providing the two voltages as a-c voltages, rectifying a given plurality of 1 ... n half waves of the one voltage being integrated up, and rectifying the same given plurality of half waves of the other voltage being integrated down.

In accordance with an added mode of the invention there is provided a method, which comprises integrating both (negative and positive) half waves of a period. In this way, asymmetries of the network in integrating up as well as in integrating down d-c voltage components, for instance, are eliminated.

In accordance with still another mode of the invention there is provided a method, which comprises starting the down integration and ending the up integration at the same time, such as at a zero crossing. The immediate sequence of up and down integration over one period each lessens the danger that network variations are measured concurrently, as compared to methods in which pauses occur between the determination of the two a-c voltages.

In accordance with still an additional mode of the invention there is provided a method, which comprises determining the difference voltage over a plurality of integration cycles each including an up and a down integration to form an integration phase, and dividing the sum voltage generated at the integrator by the number of integration cycles. Two important advantages are obtained due to this measure. Thus, the influence of network voltage fluctuations is reduced substantially because a quasi statistical mean value of the measured value is formed by the multiple up and down integration. Furthermore, integrating over several measuring cycles leads to larger absolute values of the voltage on one hand and to an improved measuring accuracy by the formation of mean values, on the other hand, especially for small difference voltages. Due to the intermediate down integration after each half wave, the output voltages at the integrator remain relatively small, so that the following modules need not have a large dynamic range.

In accordance with an still a further mode of the invention, there is provided a method, which comprises limiting the length or the number of integration cycles in an integration phase for blocking or inhibiting a repetition of the integration cycle as soon as the value of the sum at the integrator reaches a given limit. For example, this can prevent the requirement for an unnecessarily large amount of integration cycles to be made available for one integration phase, for larger difference voltages.

In accordance with again an added mode of the invention there is provided a method, which comprises setting the integrator to zero in a discharge phase prior to a new integration phase, and transferring the sum voltage formed at the integrator in a measuring value transfer phase following each integration phase.

In accordance with again another mode of the invention there is provided a method, which comprises short-circuiting the input of the integrator following the discharge phase in an offset phase having a duration equal to the integration phase, and subtracting the offset voltage from the sum voltage in an offset transfer phase following the offset phase. The measuring accuracy attainable with the method can be improved in this way. During this offset phase, the input of the integrator is short-circuited and then the offset voltage resulting at the integrator is determined. In the offset transfer phase following the offset phase, the offset voltage is added with reverse sign to the sum voltage formed during the integration phase.

In accordance with yet an added mode of the invention there is provided a method, which comprises carrying out the measuring cycle with a zero phase, an integration phase, a measured value transfer phase, a discharge phase, an offset phase and an offset transfer phase to produce a measured value, and transferring the measured value directly or after an analog-to-digital conversion and possibly after a numerical processing, to a memory at the end of a measuring cycle, and displaying the measured value for a limited time.

The result of several measuring cycles can also be displayed similar to the manner in which the measuring accuracy can be increased by several integration cycles and subsequent formation of the mean value.

In accordance with yet a further mode of the invention there is provided a method, which comprises displaying the result of several measuring cycles, interim-storing the measured value after each measuring cycle, adding the measured value to measured values of other measuring cycles, and forming a mean value from the measured values.

In accordance with yet an additional mode of the invention there is provided a method, which comprises forming the voltages as a-c voltages by lowering the voltage by applying different loads on an a-c voltage source, and controlling the load change synchronously in time with the measuring cycle. One of the most important applications of the measuring method according to the invention is in connection with lowering the voltage. In this case the different a-c voltages are generated by loading the a-c voltage source differently. The change in load is controlled in this case in such a manner that it is synchronous in time with the measuring cycle. By combining the prior art voltage-lowering method with the principle of up/down integration according to the invention, it is possible to measure the contact voltage or the internal impedance of the network in a-c voltage networks.

In accordance with yet an added mode of the invention there is provided a method, which comprises generating a first load state corresponding to a no-load state, and generating a second load state with a constant impressed load current with a wave form equal or corresponding to that of the a-c voltage. By loading the network voltage source with a constant current instead of with an otherwise customary ohmic resistance, a separate measurement of the load current is omitted. The measured difference voltage depends, of course, on the load current which, if it is not impressed, changes with the prevailing loop resistance and the voltage of the network. It is a further advantage that the transient phenomenon occurring when the load is connected is largely eliminated, since the current is forced-on sinusoidally.

In connection with the measuring method according to the invention and the increased measuring accuracy obtained thereby, the impressed load current can be reduced by a factor of 10 to 100 as compared with known methods. If the method is used for checking protective measures in electrical installations, the measurement can be performed with substantially less danger with the smaller load current, because the contact voltages occurring in such a case are lower. Relatively lightly fused circuits (equal to or smaller than 1.5 A) can still be tested therewith. In the case of checking protective measures in electrical; installations, still further quantities can be determined by the measuring method according to the invention.

In accordance with still another mode of the invention there is provided a method, which comprises directly evaluating the internal impedance of the a-c voltage source from the determined difference voltage and the constant load current, and determining a short-circuit current from the no-load voltage measured in the no-load state of the a-c voltage source and its internal impedance.

In order to implement the method, there is provided a measuring device for measuring the difference between two voltages with a time-controlled measuring cycle, comprising an a-c voltage source, first and second voltage dividers connected to the a-c voltage sources, a comparator connected to the first voltage divider, a logic module connected to the comparator, controlling and computing means, preferably a microprocessor, connected to the logic module for automatically determining the zero crossings of the a-c voltages, first, second and third switches connected to the automatic determining means for controlling the switches in dependence on the zero crossings according to a given program, an integrator having an input and output, the first and second switches being connected in parallel between the second voltage divider and the input of the integrator, an inverter connected in series ahead of or between one of the first and second switches and the second voltage divider, and the third switch short circuiting the output of the integrator.

In accordance with again an additional feature of the invention there is provided a device which includes an analog/digital converter having an input connected to the output of the integrator and having an output connected to the automatic determining means or microprocessor, and a display connected to the analog/digital converter through the automatic determining means. This is done for evaluating the voltages present at the output of the integrator. After the integration which is initially analog, the further processing of the measured value is digital.

In accordance with again an added feature of the invention there is provided a device which includes a fourth switch controlled by the automatic determining means, the fourth switch being connected between the second voltage divider and the parallel-shunt-connected first and second switches for short circuiting the input of the integrator and thereby carrying out the offset phase.

In accordance with again a further feature of the invention there is provided a measuring device which includes a fifth switch and a load resistor connected in series with the fifth switch, the fifth switch and the load resistor being connected to the voltage source connected to the voltage dividers for loading the voltage source. The fifth switch and the load resistor short the two voltage dividers and therefore permit the measurement of the no-load voltage and an a-c voltage under load, controlled by the microprocessor synchronously in time with the measuring cycle.

In accordance with yet another feature of the invention, the voltages are d-c voltages and the title control of the measuring cycle is provided by a measure internal clock frequency.

In accordance with yet an additional feature of the invention, one of the voltages is an a-c voltage and the other is a d-c voltage.

An entirely different application of the measuring method according to the invention is obtained if both voltages are d-c voltages or if one of the two voltages is an a-c voltage and the other is a d-c voltage and the d-c voltage has a predetermined adjustable value.

In accordance with yet a further feature of the invention, one of the two voltages, preferably a d-c voltage, serves as a reference value for suppressing part of the other voltage to be measured. The remaining difference voltage which is the point of the measurement, permits increase reading accuracy if the analog scale serving for the indication is spread out accordingly.

In accordance with a concomitant mode of the invention there is provided a method, which comprises using one of the two voltages as a reference value for suppressing part of the other voltage to be measured, and adjusting the reference value for shifting the range of the difference voltage expanded by the suppression, over the measuring range. By changing the reference value, the spread-out range of the difference voltage U can be shifted over any desired measuring range.

A measurement of the difference of two-d-c voltages by means of up/down integration is preferred over a direct measurement of the difference voltage, particularly if the two voltages come from different voltage sources which are at different potential and therefore cannot be tied together.

Other features which are considered as characteristic for the invention are set forth in the appended claims.

Although the invention is illustrated and described herein as embodied in a measuring method for determining the difference between an a-c voltage and another voltage, as well as a measuring device for carrying out the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a basic schematic circuit diagram of the measuring device according to the invention; and FIG. 2 is a graph of the measuring cycle and the signals occurring during a measurement of the internal network impedance.

Referring now to the figures of the drawings in detail and first, particularly, to FIG. 1 thereof, it is seen that two voltage dividers $T_1$ and $T_2$ are connected to a network voltage between a phase L and a neutral conductor N. Of course, the network voltage could also be measured between the phase and a protective conductor or between two phases. Only the zero crossings of the a-c voltage present at the voltage divider $T_1$ are determined by a comparator K and a logic module F, and the positive as well as the negative zero crossing are fed to a microprocessor 1 as a timing signal. The microprocessor 1 controls a multiplicity of functional elements in dependence on the zero crossings. Thus, the d-c voltage taken off at the second voltage divider $T_2$ is fed to the input of an integrator $V_2$ through two switches $S_1$ and $S_2$. An inverter $V_1$ which reverses the negative a-c voltage half-wave is connected ahead of the switch $S_2$, so that a rectified positive voltage is generated in both branches of the circuit. The integrator, which is formed of the amplifier $V_2$ and the capacitor $C_1$, permits the integration of the rectified half waves. The output voltage of the integrator $V_2/C_1$ is fed to an analog-to-digit converter 2 which permits the further processing of the measured value. The further processing takes place in or by means of, the microprocessor 1, which presents the measured or computed value digitally on a display 3.

A third switch $S_3$ shunting the output of the integrator $V_2/C_1$ serves for discharging the capacitor $C_1$ after each integration phase and a subsequent measured-value transfer phase. The discharge phase can also be followed by an offset phase, while the input of the integrator $V_2/C_1$ can also be shorted ahead of the inverter $V_1$ by means of a fourth switch $S_4$. In this way, no measured voltage derived from the a-c voltage is able to be integrated during the offset phase, but only a fault voltage internal to the circuit. The network voltage source L/N can be loaded by a resistance RL, through a fifth switch $S_5$. The change between load and load which can be controlled by the fifth switch $S_5$ lead two different voltages at the voltage divider $T_2$.

The difference voltage obtained thereby is determined by the measuring device and is presented directly on the display 3 as a voltage or resistance value or a short-circuit current. In FIG. 2, a signal cycle is shown which is obtained by measuring the internal network impedance. In this case, an integration phase is limited to two measuring cycles with one up and down integration each. These are the signals of the a-c network voltage, the start signal, the control signals of all of the switches $S_1$ to $S_5$, the signal of the difference voltage $\Delta U$ measured at the integrator output or its mean value, and the control signal if the analog/digital converter for transferring the signal taken off at the integrator output. The presentation extends over 12 periods of the a-c voltage signal and during the first period it comprises the neutral phase in which the starting signal is located; from the second to the fifth period it comprises an integration phase with two integration cycles having one up and one down integration each; in the sixth period it comprises a measured value transfer phase; in the seventh period it comprises a discharge phase; in the eight to eleventh period it comprises an offset phase, and in the twelfth period, it comprises an offset transfer phase.

After the zero phase, the up integration starts. The logic module F signals the positive or negative voltage zero crossing, respectively, to the microprocessor. The microprocessor starts the up integration with the positive zero crossing, the third switch $S_3$ being open. The measuring voltage matched by the divider $T_2$ is fed through the first switch $S_1$ for the positive half-wave and through the inverter er $V_1$ and the second switch $S_2$ for the negative half-wave to the integrator $V_2/C_1$. A mean value of the measured voltage which is proportional to the applied half waves, appears at the integration capacitor $C_1$.

The down integration immediately follows the up integration. The start is derived from the zero crossing, through the comparator K and the logic module F, as mentioned above.

When the load resistance RL is connected through the fifth switch $S_5$, the second switch $S_2$ for the positive half-wave and the first switch $S_1$ for the negative half-wave are simultaneously closed. In other words, the switches $S_1$ and $S_2$ which cause rectification, are controlled in an inverted manner relative to the up-integration.

The difference voltage $\Delta U$ which is formed at the integration capacitor $C_1$ is proportional to the internal impedance of the network, for the same time interval for the up and down integration.

The measurement voltage $\Delta U$ is taken off at the integration capacitor $C_1$ and is available at the analog/digital converter 2 at the same time. At the end of an integration cycle, the microprocessor calls up the instantaneous value of the analog/digital converter.

An integration cycle may be formed of one or more up and down integrations. If the method is used for checking protective measures in electrical installations, it is advantageous to limit the integration phase to 0.2 seconds in order to avoid the danger of contact in case of impermissibly high grounding or loop resistances. On the other hand, a measuring operation can also be expanded to several integration cycles for reducing measurement errors particularly in the case of low-resistance voltage sources. The first integration cycle with the duration of 0.2 seconds at the same time contains a pretest for determining the order of magnitude of the measurement value of the contact voltage. If the measuring range in this case is already driven far enough or the contact voltage is too high, further integration cycles are blocked.

If the microprocessor has accepted the measured value as valid, the measured value is transferred immediately at the start of the voltage period following the down integration. In a further period, the integration capacitor is then discharged through the third switch $S_3$.

In the following offset phase, the input of the integrator $V_2/C_1$ is short-circuited even before the two switches $S_1$, $S_2$ by a fourth switch $S_4$. In the same rhythm as during the integration phase from the second to the fifth period, the two switches $S_1$ and $S_2$ are now switched during the eighth to the eleventh period. The offset voltage thus generated at the integration capacitor is likewise called up by the analog/digital converter by the microprocessor in the twelfth period and the measured value is corrected accordingly. Since the measuring path accurately corresponds to the offset path and the time interval is also chosen to be completely identical, the offset voltage is optimally compensated.

The microprocessor drives the display with the thus corrected measurement value. The last-obtained measurement value is continued to be displayed for about 15 seconds. After this time, or even earlier, a new measuring phase can be initiated by a starting pulse.

We claim:

1. Method for measuring a mean voltage value difference between two conductors having respective voltages thereon during a time-controlled measuring cycle, which comprises feeding the two voltages with opposite polarity to one integrator, integrating initially up one of the voltages and subsequently integrating down the other of the voltages with the integrator, during an integration cycle in which the time of integrating up is equal to the time of integrating down, and delivering a voltage corresponding to the mean value of the voltage difference between the conductors at an output of the integrator at the conclusion of the integration cycle.

2. Method according to claim 1, which comprises providing the two voltages as a-c voltages, rectifying a given plurality of half waves of the one voltage being integrated up, and rectifying the same given plurality of half waves of the other voltage being integrated down.

3. Method according to claim 2, which comprises integrating both half waves of a period.

4. Method according to claim 1, which comprises starting the down integration and ending the up integration at the zero crossing of one period of the a-c voltages.

5. Method according to claim 1, which comprises determining the difference voltage over a number of integration cycles, each cycle including an up and a down integration to form an integration phase, and dividing the voltage generated at the output of the integrator, at the end of the integration phase, by the number of integration cycles.

6. Method according to claim 5, which comprises limiting the number of integration cycles in an integration phase for blocking a repetition of the integration cycle as soon as the value of the output voltage of the integrator reaches a given limit.

7. Method according to claim 5, which comprises setting the integrator to zero in a discharge phase prior to a new integration phase, and transferring the output voltage of the integrator in a measuring value transfer phase following each integration phase.

8. Method according to claim 1, which comprises carrying out the measuring cycle with a zero phase, an integration phase, a measured value transfer phase, a discharge phase, an offset phase and an offset transfer phase to produce a measured value, and transferring the measured value directly to a memory at the end of a measuring cycle, and displaying the measured value for a limited time.

9. Method according to claim 1, which comprises carrying out the measuring cycle with a zero phase, an integration phase, a measured value transfer phase, a discharge phase, an offset phase and an offset transfer phase to produce a measured value, and transferring the measured value after an analog-to-digital conversion to a memory at the end of a measuring cycle, and displaying the measured value for a limited time.

10. Method according to claim 1, which comprises carrying out the measuring cycle with a zero phase, an integration phase, a measured value transfer phase, a discharge phase, an offset phase and an offset transfer phase to produce a measured value, and transferring the measured value after a numerical processing to a memory at the end of a measuring cycle, and displaying the measured value for a limited time.

11. Method according to claim 1 wherein said voltages are a-c voltages having a voltage source, which comprises measuring the different voltages on the a-c voltages by lowering the voltage by applying different loads to the a-c voltage source, and applying the loads synchronously in time with the measuring cycle.

12. Method according to claim 1, which comprises using one of the two voltages as a reference value for suppressing part of the other voltages to be measured, and adjusting the reference value for shifting the range of the difference voltage expanded by the suppression, over the measuring range.

13. Method according to claim 1, comprising the steps of rectifying ac-voltages being present on said two conductors, forming a given number of half waves of one polarity being integrated up and integrating down said same number of half waves of the opposite polarity.

14. Measuring device for measuring the difference between two voltages on two conductors with a time-controlled measuring cycle, comprising first and second voltage dividers connected to conducters a comparator connected to said first voltage divider, a logic module connected to said comparator, means connected to said logic module for automatically determining the zero crossings of the voltages on said conductors, first, second and third switches said automatic determining means in dependence on the zero crossings according to a given program, an integrator having an input and output, said first switch being connected between said second voltage divider and said input of said integrator, an inverter connected in series with second switch and said second voltage divider, and said third switch short circuiting said output of said integrator.

15. Measuring device according to claim 14, including an analog/digital converter having an input connected to said output of said integrator and having an output connected to said automatic determining means, and a display connected to said analog/digital converter through said automatic determining means.

16. Measuring device according to claim 14, including an fourth switch controlled by said automatic determining means, said fourth switch being connected across the input of said integration for short circuiting said input of said integrator.

17. Measuring device according to claim 16, including a fifth switch and a load resistor connected in series with said fifth switch, said fifth switch and said load resistor being connected to said voltage source connected to said voltage dividers for loading said voltage source.

18. Measuring device according to claim 14, wherein the voltages are d-c voltages and the time control of the measuring cycle is provided by a measured internal clock frequency.

19. Measuring device according to claim 14, wherein one of the voltages is an a-c voltage and the other is a d-c voltage.

20. Method for measuring a mean voltage value difference between two conductors having respective voltages thereon, during a time-controlled measuring cycle, which comprises feeding the two voltages with opposite polarity to one integrator; integrating initially up one of the voltages and subsequently integrating down the other of the voltages with the integrator during each integration cycle and using a definite number of integration cycles to form an integration phase; dividing the resulting voltage generated at the output of the integrator by the number of integration cycles: limiting the number of integration cycles in an integration phase for blocking a repetition of the integration cycle as soon as the value of the output value of the integrator reaches a given limit; and delivering a voltage corresponding to the mean value of the voltage difference between the conductors at an output at the conclusion of the integration phase.

21. Method for measuring a mean voltage value difference between two conductors having respective voltages thereon, during a time-controlled measuring cycle, which comprises feeding the two voltages with opposite polarity to one integrator, integrating initially up one of the voltages and subsequently integrating down the other of the voltages with the integrator in an integration cycle; determining the difference voltage over a number of integration cycles, each integration cycle including an up and down integration to form an integration phase, and dividing the voltage generated at the integrator output by the number of integration cycles; setting the integrator to zero in a discharge phase prior to a new integration phase, and transferring the output voltage formed at the integrator output in a measuring value transfer phase following each integration phase, and delivering a voltage corresponding to the mean value of the voltage difference between the conductors at the conclusion of an integration cycle.

22. Method according to claim 21, which comprises short circuiting the input of the integrator following the discharge phase in an offset phase having a duration equal to the integration phase, and subtracting an offset voltage from the sum voltage in an offset transfer phase following the offset phase.

23. Method for measuring a mean voltage value difference between two conductors having respective voltages thereon, during a time-controlled measuring cycle, which comprises feeding the two voltages with opposite polarity to one integrator, integrating initially up one of the voltages and subsequently integrating down the other of the voltages with the integrator in an integration cycle; delivering a voltage corresponding to the mean value of the voltage difference between the conductors at the conclusion of an integration cycle; carrying out the measuring cycle with a zero phase; an integration phase; a measured value transfer phase; an offset phase; an offset transfer phase to produce a measured value; transferring the measured value directly to a memory at the end of a measuring cycle, and displaying the measured value for a limited time.

24. Method according to claim 23, which comprises displaying the result of several measuring cycles, interim-storing the measuring value after each measuring cycle, adding the measured value to measured values of other measuring cycles, and forming a mean value from the measured values.

25. Method for measuring a mean voltage value difference between two conductors having respective voltages thereon, during a time-controlled measuring cycle, which comprises feeding the two voltages with opposite polarity to one integrator, integrating initially up one of the voltages and subsequently integrating down the other of the voltages with the integrator in an integration cycle; delivering a voltage corresponding to the mean value of the voltage difference between the conductors at the conclusion of an integration cycle; carrying out the measuring cycle with a zero phase; an integration phase; an offset phase; an offset transfer phase to produce a measured value; transferring the measured value after an analog-to-digital conversion to a memory at the end of a measuring cycle, and displaying the measured value for a limited time.

26. Method for measuring a mean voltage value difference between two conductors having respective voltages thereon, during a time-controlled measuring cycle, which comprises feeding the two voltages with opposite polarity to one integrator, integrating initially up one of the voltages and subsequently integrating down the other of the voltages with the integrator in an integration cycle; delivering a voltage corresponding to the mean value of the voltage difference between the conductors at the conclusion of an integration cycle; carrying out the measuring cycle with a zero phase; an integration phase; a measured value transfer phase; a discharge phase; an offset transfer phase; an offset transfer phase to produce a measured value, and transferring the measured value after a numerical processing to a memory at the end of a measuring cycle; and displaying the measured value for a limited time.

27. Method for measuring a mean voltage value difference between two conductors having respective voltages thereon, during a time-controlled measuring cycle, which comprises feeding the two voltages with opposite polarity to one integrator, integrating initially up one of the voltages and subsequently integrating down the other of the voltages with the integrator in an integration cycle; delivering a voltage corresponding to the mean value of the voltage difference between the conductors at the conclusion of an integration cycle, wherein the different voltages are a-c voltages; further including measuring the different voltages on the a-c voltages by lowering the voltage by applying different loads to the a-c voltage source; and applying the loads synchronously in time with the measuring cycle.

28. Method according to claim 27, which comprises generating a first load state corresponding to a no-load state, and generating a second load state with a constant impressed load current with a wave form equal to that of the a-c voltage.

29. Method according to claim 28, which comprises directly evaluating an internal impedance of the a-c voltage source from the difference voltage and the constant load current, and determining a short-circuit current from the no-load voltage measured in the no-load state of the a-c voltage source and its internal impedance.

30. Method for measuring a mean voltage value difference between two conductors having respective voltages thereon, during a time-controlled measuring cycle, which comprises feeding the two voltages with opposite polarity to one integrator, integrating initially up one of the voltages and subsequently integrating down the other of the voltages with the integrator in an integration cycle; delivering a voltage corresponding to the mean value of the voltage difference between the conductors at the conclusion of an integration cycle; using one of the two voltages as a reference value for suppressing part of the other voltage to be measured; and adjusting the reference voltage for shifting the range of the difference voltage expanded by the suppression, over the measuring range.

* * * * *